(12) United States Patent
Eritate et al.

(10) Patent No.: US 7,036,915 B2
(45) Date of Patent: May 2, 2006

(54) COMPOSITION FOR FORMING PIEZOELECTRIC FILM, PRODUCING METHOD FOR PIEZOELECTRIC FILM, PIEZOELECTRIC ELEMENT AND INK JET RECORDING HEAD

(75) Inventors: Shinji Eritate, Kanagawa (JP); Motokazu Kobayashi, Kanagawa (JP); Makoto Kubota, Kanagawa (JP); Fumio Uchida, Osaka (JP); Chiemi Shimizu, Osaka (JP); Kenji Maeda, Osaka (JP)

(73) Assignees: Canon Kabushiki Kaisha, Tokyo (JP); Fuji Chemical Co., Ltd., Osaka (JP)

( * ) Notice: Subject to any disclaimer, the term of this patent is extended or adjusted under 35 U.S.C. 154(b) by 170 days.

(21) Appl. No.: 10/665,571

(22) Filed: Sep. 22, 2003

(65) Prior Publication Data

US 2004/0129918 A1    Jul. 8, 2004

(30) Foreign Application Priority Data

Sep. 20, 2002    (JP)    ............ 2002-275599

(51) Int. Cl.
*B41J 2/045*    (2006.01)
(52) U.S. Cl. .......................... 347/68; 347/70
(58) Field of Classification Search ........... 252/62.9 R, 252/62.9 PZ; 501/134, 135; 106/282, 286, 106/287; 347/68–73; 427/100
See application file for complete search history.

(56) References Cited

U.S. PATENT DOCUMENTS

| | | | | |
|---|---|---|---|---|
| 4,428,859 | A | * 1/1984 | Koch et al. | 252/301.17 |
| 6,099,604 | A | * 8/2000 | Sandhu et al. | 51/307 |
| 6,109,738 | A | * 8/2000 | Miyata et al. | 347/71 |
| 6,277,294 | B1 | 8/2001 | Ozaki et al. | 216/27 |
| 6,331,259 | B1 | 12/2001 | Ozaki et al. | 216/27 |
| 6,382,775 | B1 | 5/2002 | Kubota et al. | 347/62 |
| 6,391,527 | B1 | 5/2002 | Yagi et al. | 430/313 |
| 6,436,301 | B1 | 8/2002 | Hiroki et al. | 216/27 |
| 6,474,780 | B1 | 11/2002 | Kubota et al. | 347/45 |

FOREIGN PATENT DOCUMENTS

| | | |
|---|---|---|
| JP | 9-92897 | 4/1997 |
| JP | 10-139594 | 5/1998 |
| JP | 10-290035 | 10/1998 |

OTHER PUBLICATIONS

C. V. R. Vasant Kumar, et al., "Lead Zirconate Titanate Films by Rapid Thermal Processing," Appl. Phys. Lett., vol. 58, No. 11, Mar. 18, 1991, pp. 1161-1163.

* cited by examiner

*Primary Examiner*—Manish Shah
*Assistant Examiner*—Geoffrey S. Mruk
(74) *Attorney, Agent, or Firm*—Fitzpatrick, Cella, Harper & Scinto (57) ABSTRACT

A composition for forming a piezoelectric film containing a dispersoid obtained from a metallic compound includes at least one of 1,8-diazabicyclo[5.4.0]-7-undecene, 1,5-diazabicyclo[4.3.0]non-5-ene, and 1,4-diazabicyclo[2.2.2]octane.

7 Claims, 3 Drawing Sheets

COMPOSITION FOR FORMING PIEZOELECTRIC FILM, PRODUCING METHOD FOR PIEZOELECTRIC FILM, PIEZOELECTRIC ELEMENT AND INK JET RECORDING HEAD

BACKGROUND OF THE INVENTION

1. Field of the Invention

The present invention relates to a composition for forming a piezoelectric film, a method for producing a piezoelectric film, and an ink jet recording head provided with such piezoelectric element.

2. Related Background Art

A piezoelectric element is constituted of piezoelectric crystalline ferroelectric or paraelectric ceramics. The piezoelectric ceramics generally have a two-component system principally constituted of lead zirconate-titanate (hereinafter called "PZT"), or a three-component system in which a third component is added to PZT of the two-component system. A ferroelectric substance employing the two-component PZT is described in Applied Physics Letters 1991, vol. 58, No. 11, pp 1161–1163. For forming a piezoelectric thin film of such metal oxide type, there are known a sputtering method, an MOCVD method and a sol-gel method.

There is also disclosed an ink jet printing head utilizing a piezoelectric element employing a film formed by the sol-gel method. For example, Japanese Patent Applications Laid-open Nos. H9-92897, H10-139594 and H10-290035 disclose a method forming a piezoelectric thin film of a piezoelectric element usable for an ink jet printing head, by the sol-gel method, by coating a sol containing a piezoelectric material plural times on a lower electrode and repeating a heating process.

However, by simply dissolving an ordinary metal complex or a metal salt of an organic acid in a solvent as a composition for forming a piezoelectric film by the sol-gel method, it is difficult to obtain a uniform composition since the organometallic compounds having respectively different hydrolyzing rates respectively form single metal oxides. Also at sintering process, a complex is formed by a solid-phase reaction of such metal oxides, but it is difficult to obtain a uniformly controlled composition in the thin film because of a difference in the volatility thereof. Also at the film formation, there is often formed a film of a fine powder state, tending to generate an electrical conductivity.

Against these issues it is known to add a stabilizer for controlling a rapid hydrolysis, and such method is considered to contribute to the stabilization of the coating liquid and the stabilization of the film formation.

As the stabilizer, there have been utilized a β-diketone, a ketoacid, a lower alkyl ester of such ketoacid, an oxyacid, a lower alkyl ester of such oxyacid, an oxyketone, an α-amino acid, an alkanolamine etc. Such stabilizer stabilizes a metal alkoxide and/or a metal salt by chelating, thereby reducing the rate of hydrolysis reaction. For example an alkoxide of Ti or Zr is reacted with acetylacetone to reduce the reaction rate of hydrolysis, thereby obtaining a dense film.

However, the use of such stabilizer may still be unable to provide a satisfactory result because a conversion from an alkoxide to an oxide is incomplete to generate an incompletely dense film composed of fine particles, thereby leading to a fluctuation in the composition by a loss of a more volatile metal component or to a fluctuation in the piezoelectric property. Also a film formation with the above-mentioned stabilizer result in uneven sizes of the particles constituting the thin film. In the thin film with such uneven surface state, the piezoelectric property may become uneven depending on the location.

Also from the standpoint of the manufacture of a piezoelectric element, it is considered more efficient to obtain a larger film thickness in a single layer to be formed, and necessary to have measures for attaining such thickness. Also for use as an actuator, there is required a dense film showing uniform characteristics as a piezoelectric element on the film surface and being excellent in the durability. Also a formation of a thick film results in defects such as a cracking in the film, and is associated with insufficient characteristics as an actuator. Also a conventional method for producing a composition for forming the piezoelectric film, the composition may show a precipitate generation by a polymerization reaction in the liquid in case of a prolonged storage, thus not being usable in stable manner over a prolonged period.

SUMMARY OF THE INVENTION

An object of the present invention is to provide a composition for forming a piezoelectric film showing little unevenness in the surface state and capable of providing satisfactory piezoelectric characteristics, a producing method for such piezoelectric film, a piezoelectric element and an ink jet recording head.

The present invention employs, as a stabilizer, at least one of 1,8-diazabicyclo[5.4.0]-7-undecene, 1,5-diazabicyclo[4.3.0]non-5-ene, and 1,4-diazabicyclo[2.2.2]octane. It stabilizes a metal alkoxide and/or a metal salt by an electron donation from 1,8-diazabicyclo[5.4.0]-7-undecene, 1,5-diazabicyclo[4.3.0]non-5-ene, and 1,4-diazabicyclo[2.2.2]octane. At the same time, it is intended to vary the reactivity and solubility of metal alkoxide and/or metal salt, thereby controlling a rate of hydrolysis at sol synthesis, a rate of condensation-polymerization reaction and a structure of the resulting reaction product. It is thus found possible to attain an improvement in the characteristics of a piezoelectric element, an improvement in the storability of the composition for forming the piezoelectric film and an improvement in the performance of the ink jet recording head, thereby arriving at the present invention.

The piezoelectric film forming composition of the present invention is a composition for forming a piezoelectric film containing a dispersoid obtained from an organometallic compound for forming a piezoelectric film, featured in containing, as a stabilizer in the solution, at least one of 1,8-diazabicyclo[5.4.0]-7-undecene, 1,5-diazabicyclo[4.3.0]non-5-ene, and 1,4-diazabicyclo[2.2.2]octane.

The piezoelectric film forming composition of the present invention is featured in having a content of 1,8-diazabicyclo[5.4.0]-7-undecene, 1,5-diazabicyclo[4.3.0]non-5-ene, and 1,4-diazabicyclo[2.2.2]octane within a range from 0.005 to 5.0 times in moles with respect to a number of moles of all metallic atoms in the piezoelectric film forming composition.

Also the piezoelectric film forming composition of the present invention is featured in containing, at least one of elements Pb, La, Zr and Ti as a constituent element.

A producing method of the present invention for producing a piezoelectric element is featured by repeating steps of coating the aforementioned piezoelectric film forming composition on a heat-resistant substrate and executing heating in the air, in an oxidizing atmosphere or in a vapor-containing atmosphere until a film of a desired thickness is obtained, and sintering the film at or above a crystallizing temperature during or after the heating at least in the final step.

An ink jet recording head of the present invention is an ink jet recording head provided with a piezoelectric element produced by the aforementioned producing method for the piezoelectric film, featured in including a pressure chamber substrate on which a pressure chamber is formed, a vibration plate provided on a surface of the pressure chamber, and the piezoelectric element provided in a position of the vibration plate corresponding to the pressure chamber and so constructed as to cause a volume change in the pressure chamber.

The present invention can provide a composition for forming a piezoelectric film showing little unevenness in the surface state and capable of providing satisfactory piezoelectric property even in a thick film formation, a method for forming such piezoelectric film, a piezoelectric element and an ink jet recording head.

DESCRIPTION OF THE PREFERRED EMBODIMENTS

In the following, there will be explained embodiments for executing the present invention.

Figure 1:
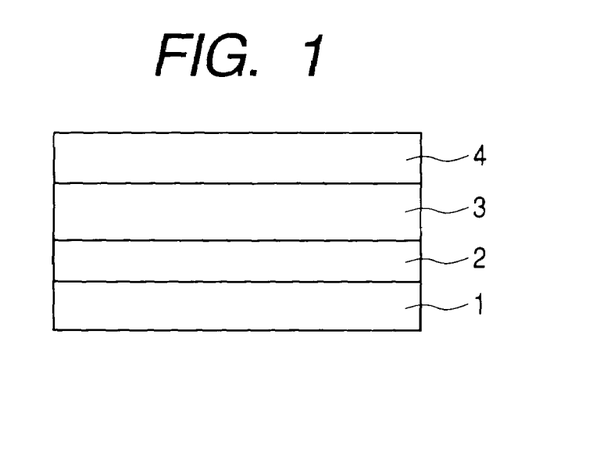
FIG. 1 is a cross-sectional view schematically showing a piezoelectric element of the present invention.

FIG. 1 is a view showing the configuration of an embodiment of the piezoelectric element of the present invention, wherein shown is a substrate 1.

There is preferably employed a semiconductor substrate such as of silicon (Si) or tungsten (W), but there can also be employed a ceramic material such as zirconia, alumina or silica. Also there may be formed an oxide layer or a nitride layer as an outermost surface.

Referring to FIG. 1, lower and upper electrodes 2, 4 in the present invention are formed by a conductive layer of about 5 to 500 nm. More specifically, there is employed one or more of metals such as Ti, Pt, Ta, Ir, Sr, In, Sn, Au, Al, Fe, Cr, Ni etc. and oxides thereof in a laminar form.

Such metal or oxide may be formed on the substrate by coating and sintering by a sol-gel method, or by sputtering or evaporation. Also each of the lower electrode and the upper electrode may be patterned in a desired shape.

Referring to FIG. 1, a piezoelectric film 3 is prepared by a sol-gel method from a substance containing, as a constituent element, at least one of elements Pb, La, Zr and Ti. More specifically, it can be obtained by dissolving an alkoxide and/or a metal salt of Pb, La, Zr, Ti etc. in a solvent, then adding water for executing a hydrolysis to obtain a coating liquid, coating and drying such coating liquid on a substrate and executing a sintering in a subsequent heat treatment step.

In addition to Pb, La, Zr and Ti, an element of a trace amount may be used for doping. Specific examples include Ca, Sr, Ba, Sn, Th, Y, Sm, Ce, Bi, Sb, Nb, Ta, W, Mo, Cr, Co, Ni, Fe, Cu, Si, Ge, Sc, Mg, Mn etc. Its content is 0.05 or less in atomic fraction of the metal atoms in a general formula $Pb_{1-x}La_x(Zr_yTi_{1-y})O_3$ (wherein $0 \leq x < 1$, $0 \leq y \leq 1$).

Organometallic compounds to be employed as raw materials of metal components of the piezoelectric film are dispersed together in a suitable organic solvent to prepare a raw material sol containing a precursor of a complex organic metal oxide (oxide containing two or more metals) which is a piezoelectric material. The solvent for the sol is selected suitably from various known solvents in consideration of the dispersion property and the coating property.

Examples of the solvent include an alcoholic solvent such as methanol, ethanol, n-propanol, isopropanol, n-butanol, s-butanol, or t-butanol; an ether solvent such as tetrahydrofuran or 1,4-dioxane; a cellosolve solvent such as 2-methoxyethanol, 2-ethoxyethanol, or 1-methoxy-2-propanol; a polyhydric alcohol such as diethylene glycol monoethyl ether, diethylene glycol monoethyl ether acetate, diethylene glycol monobutyl ether, or diethylene glycol monobutyl ether acetate; an amide solvent such as N,N-dimethylformamide, N,N-dimethylacetamide or N-methylpyrrolidone; and a nitrile solvent such as acetonitrile. Among these, there is preferred an alcoholic solvent. An amount of the solvent employed in the sol-gel method of the present invention is usually 5 to 200 times in moles with respect to metal alkoxide, preferably 10 to 100 times in moles. An excessively large amount of the solvent renders gellation difficult, while an excessively small amount causes a significant heat generation in hydrolysis.

Examples of alkoxide of lead include lead 2-ethoxyethoxide, lead methoxide, lead ethoxide, lead n-propoxide, lead i-propoxide, lead n-butoxide, lead i-butoxide, lead t-butoxide and other alkoxide and alkyl substituted compounds thereof.

It is also possible to employ an inorganic salt compound of Pb, more specifically a chloride, a nitrate, a phosphate or a sulfate, or an organic salt compound for example a carboxylate such as a formate, an acetate, a propionate, an oxalate, a succinate or a malate, a hydroxycarboxylate, an acetylacetonate complex, by mixing with a solvent to in situ synthesize an alkoxide. La, Mg, Zr, Ti or Nb may also be employed in an alkoxide compound or an inorganic salt in a similar manner. An alkoxide solution or an inorganic salt of Pb, La, Mg, Zr, Ti or Nb is dissolved in the aforementioned solvent and hydrolyzed to obtain a polymer compound, thereby obtaining a coating liquid for a piezoelectric film.

The organometallic compound to be employed as a raw material can be, in addition to a compound containing a metal as explained above, a complex organometallic compound containing two or more metals. Examples of such complex organometallic compound include $PbO_2[Ti(OC_3H_7)_3]_2$ and $PbO_2[Zr(OC_4H_9)_3]_2$. In the present invention, a term "an organometallic compound" is used in a wide sense indicating a compound including a metal and an organic group, not in a narrow sense indicating compound containing a carbon-metal bond.

The charging of the aforementioned metals, for example in case of employing Pb, La, Zr and Ti, can be made by $Pb_{(1-x)}La_x(Zr_yTi_{1-y})O_3$ (wherein $0 \leq x < 1$, $0 \leq y \leq 1$), but, since Pb is lost in the course of sintering at the film formation, it is preferred to increase the amount of Pb in advance at the preparation of the coating liquid. More specifically, in $Pb_{(1-x)}La_x(Zr_yTi_{1-y})O_3$ (wherein $0 \leq x < 1$, $0 \leq y \leq 1$), it is possible to increase the molar ratio of Pb by 5 to 30%.

Then a stabilizer is added to the mixed solution to achieve stabilization. This is to cause a mild polymerization of a metal-oxygen-metal bond as a whole. However, a supply of the stabilizer in a large amount may hinder an appropriate hydrolysis, or may cause precipitation because of solubility.

In the present invention, in the organometallic compound solution for the piezoelectric film forming composition, there is added, as a stabilizer, at least one of 1,8-diazabicyclo[5.4.0]-7-undecene, 1,5-diazabicyclo[4.3.0]non-5-ene, and 1,4-diazabicyclo[2.2.2]octane. A content of the stabilizer in the organometallic compound solution is within a range from 0.005 to 5.0 times in moles with respect to the moles of total metal atoms, preferably 0.05 to 2.5 times in moles, since an excessively small content cannot provide a sufficient improving effect by such addition while an excessively large content increases the viscosity thereby deteriorating the film forming property. 1,8-diazabicyclo[5.4.0]-7-undecene, 1,5-diazabicyclo[4.3.0]non-5-ene, and 1,4-diazabicyclo[2.2.2]octane may be employed in a combination of plural kinds. Also they may be employed as a salt combined with an acid. Specific examples include a formic acid salt and an octylic acid salt. It is also possible to employ, in combination, another known stabilizer for example a β-diketone (such as acetylacetone, heptafluorobutanoyl pivaroyl methane, dipivaloylmethane, trifluoroacetylacetone, or benzoylacetone), a ketoacid (such as acetacetic acid, propionylacetic acid, or benzoylacetic acid), a lower alkyl (such as ethyl, propyl or butyl) ester of such ketoacid, an oxyacid (such as lactic acid, glycolic acid, α-oxybutyric acid or salicylic acid), a lower alkyl ester of such oxyacid, an oxyketone (such as diacetone alcohol or acetoin), an α-amino acid (such as glycine or alanine), or an alkanolamine (such as diethanolamine, triethanolamine or monoethanolamine).

An amount of the stabilizer to be employed in the present invention, in case at least one of 1,8-diazabicyclo[5.4.0]-7-undecene, 1,5-diazabicyclo[4.3.0]non-5-ene, and 1,4-diazabicyclo[2.2.2]octane is used in combination with the above-mentioned prior stabilizer, is usually from 0.05 to 5 times in moles with respect to the number of moles of the total metal atoms, preferably 0.1 to 1.5 times in moles.

In such case, an amount of the prior stabilizer to be used in combination is usually from 0.01 to 20 times in moles with respect to 1,8-diazabicyclo[5.4.0]-7-undecene, 1,5-diazabicyclo[4.3.0]non-5-ene, or 1,4-diazabicyclo[2.2.2]octane, preferably 0.05 to 10 times in moles.

For a hydrolysis of a solution containing a metal alkoxide and/or a metal salt, there is employed for example water in an amount of 0.05 to 30 times in moles of metal alkoxide and/or metal salt, preferably 0.5 to 15 times in moles. For such hydrolysis, there may be employed an acid catalyst and/or a base catalyst. A preferred acid catalyst is a metal salt, a halide, a mineral acid such as sulfuric acid, nitric acid or hydrochloric acid, or an organic acid such as acetic acid. Also as a base catalyst, there is often employed ammonia which can be easily eliminated by drying and sintering.

The rate of the hydrolysis reaction can be controlled for example by a kind of metal alkoxide and/or metal salt, a kind of solvent, a water concentration with respect to metal alkoxide and/or metal salt, a concentration of metal alkoxide and/or metal salt, and a stabilization by chelating of the catalyst, metal alkoxide and/or metal salt.

After the solution of the above-mentioned metal composition is hydrolyzed, a solvent of a boiling point equal to or lower than 100° C. is completely eliminated, and a solvent having a boiling point equal to or higher than 100° C. is added in an amount of 50% or higher. Examples of the employable solvent include a cellosolve such as 1-methoxy-2-propanol, 2-ethoxyethanol, or 3-methoxy-3-methylbutanol; a polyhydric alcohol such as diethylene glycol monoethyl ether, diethylene glycol monoethyl ether acetate, diethylene glycol monobutyl ether or diethylene glycol monobutyl ether acetate; and an incense oil such as terpineol, pine oil or lavender oil. There is preferred a cellosolve solvent. It is also possible to use a cellulose derivative such as ethyl cellulose or hydroxypropyl cellulose, a polymer resin such as polyvinyl alcohol, polyvinylpyrrolidone or a polyvinylpyrrolidone derivative, rosin or a rosin derivative, for a purpose of improving the coating property.

Thereafter, a stabilizer is further added in a predetermined amount, thereby suppressing the hydrolysis rate and the polymerization-condensation speed of the raw material solution and improving the stability in time thereof, without affecting the improving effect for the coating property and the surface state.

The aforementioned coating liquid is coated and dried on a lower electrode formed on a substrate. The coating can be made by a known coating method such as spin coating, dip coating, bar coating or spray coating. A relative humidity in such operation is preferably 60% or lower. A relative humidity exceeding 60% is undesirable since the coating liquid on the substrate may show a fast hydrolysis, thus providing a precitate.

A thickness per a layer after drying is not particularly restricted, but is preferably from 0.01 to 5 µm. Also a total film thickness is preferably about from 1 to 30 µm.

The drying is executed at a temperature equal to or lower than 200° C. This operation is conducted in the presence of a gas with a relative humidity of 10 to 70% at 25° C. A humidity at or above 70% is undesirable because the coating liquid on the substrate causes a fast hydrolysis thereby leading to a crack formation. On the other hand, with a humidity at or below 10%, the hydrolysis does not proceed at all whereby a temperature of a sintering process to be explained later undesirably increases. For such drying, there can be utilized a drying machine, a dryer, a hot plate, a tubular oven or an electric oven. Also a gas having a relative humidity of 10 to 70% at 25° C. can be obtained by bubbling a desired gas in water. It is also possible to introduce a gas conditioned with a humidifier or the like.

Then a sintering is executed within a range from 200 to 500° C. This operation is conducted in the presence of a gas with a relative humidity of 70 to 99% at 25° C. A humidity at or below 70% is undesirable because the hydrolysis does not proceed. For such sintering, there can be utilized a drying machine, a dryer, a hot plate, a tubular oven or an electric oven. Also a gas having a relative humidity of 70 to 99% at 25° C. can be obtained by bubbling a desired gas in water. It is also possible to introduce a gas conditioned with a humidifier or the like.

Then a sintering is executed within a range from 500 to 800° C. This operation is conducted in the presence of a gas with a relative humidity of 70 to 99% at 25° C. A humidity at or below 70% is undesirable because the hydrolysis does not proceed. For such sintering, there can be utilized a tubular oven or an electric oven. Also a gas having a relative humidity of 70 to 99% at 25° C. can be obtained by bubbling a desired gas in water. It is also possible to introduce a gas conditioned with a humidifier or the like.

The aforementioned gas containing moisture preferably flows at a constant speed on the coated surface. A stagnation of the gas is undesirable as the hydrolysis of the coating liquid is hindered. A preferred flow speed on the substrate is from 0.5 to 50 cm/sec. However, a stagnation can be tolerated in case the substrate has a small region and the moisture-containing gas is present in a large excess.

A thickness, after the sintering, per layer formed by the coating liquid is not particularly restricted but is selected within a range of 0.01 to 1 μm, preferably 0.02 to 0.9 μm in consideration of working efficiency. The above-described operation may be repeated to obtain a piezoelectric film of an arbitrary thickness. The drying step has to be executed for each layer, but the sintering and the sintering may be executed for each layer or collectively for several layers. Also the sintering may be executed only at last.

A gas present on the substrate surface from the drying step to the sintering step is preferably an oxygen-containing atmosphere, preferably with an oxygen concentration of 20 to 100%. With a concentration lower than 20%, the sintering does not proceed and cannot provide a perovskite structure.

Figure 2:
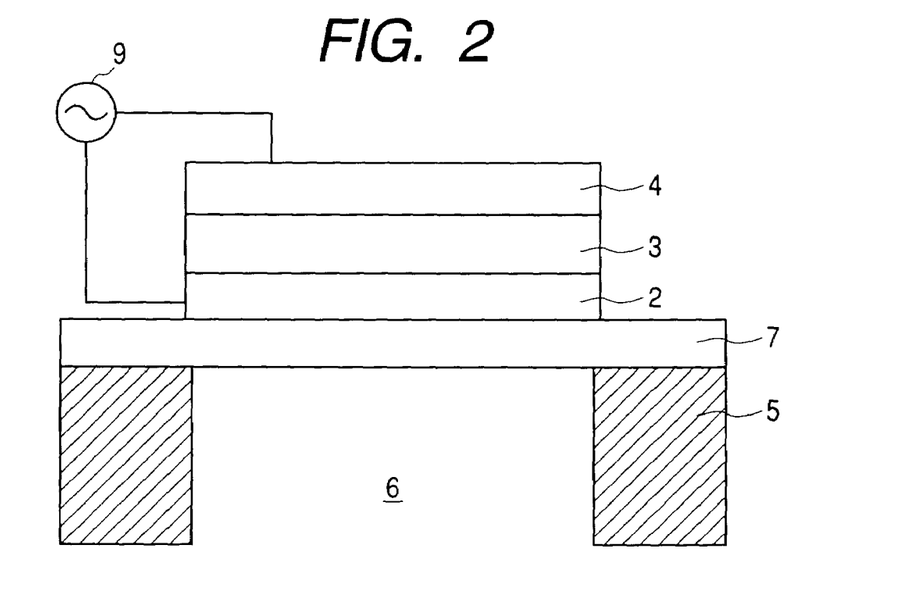
FIG. 2 is a cross-sectional view schematically showing the configuration of an ink jet printing head employing a piezoelectric element of the present invention as an actuator.

Also the sintering may be executed with stepwise temperature increases. Such sintering allows to eliminate organic components almost completely, thereby providing a piezoelectric film of a dense structure. FIG. 2, showing an embodiment of the present invention, is a schematic partial magnified view of an ink jet printing head in which a piezoelectric element is employed as an actuator. The printing head has a basic configuration same as that in the prior technology, and is constituted of a head base 5, a vibrating plate 7 and a piezoelectric element. The head base 5 is provided with a plurality of ink nozzles (not shown) for discharging ink, a plurality of ink paths (not shown) respectively communicating with the ink nozzles, and a plurality of ink chambers 6 respectively communicating with the ink paths, and the vibrating plate 7 is so mounted as to cover an entire upper surface of the head base 5, whereby the vibrating plate 7 closes upper apertures of all the ink chambers 6 of the head base 5. On the vibrating plate 7, piezoelectric elements 8 for providing the vibrating plate 7 with a vibrating force are formed in positioned respectively corresponding to the ink chambers 6. An electric power source 9 controls the plural piezoelectric elements 8 and applies a voltage to a desired piezoelectric element 8 to induce a displacement therein, thereby causing a vibration in the vibrating plate 7 in a corresponding portion. Thus an ink chamber 6, in a portion corresponding to the vibration of the vibrating plate 7, shows a change in a volume, whereby an ink is pushed out from the ink nozzle through the ink path to achieving a printing.

EXAMPLES

In the following, the present invention will be clarified in more details by examples, but the present invention is not limited by such examples unless the scope of the invention is exceeded.

Preparation Examples 1–11 of Coating Liquid

In these examples, coating liquids with a metal composition represented by $Pb_{1+x-y}La_yZr_{0.52}Ti_{0.48}$ (in which $0 \leq x \leq 0.3$, $0 \leq y \leq 1$) as shown in Table 1, for forming a piezoelectric film, were prepared in the following manner.

A lead acetate hydrate (Pb) and a lanthanum acetate hydrate (La) were mixed and dehydrated, and at least compound selected from 1,8-diazabicyclo[5.4.0]-7-undecene, 1,5-diazabicyclo[4.3.0]non-5-ene, 1,4-diazabicyclo[2.2.2]octane, a formate salt of 1,8-diazabicyclo[5.4.0]-7-undecene, and an octylate salt of 1,8-diazabicyclo[5.4.0]-7-undecene, and 1-methoxy-2-propanol (solvent 1) were mixed thereto and reacted. Hereinafter, 1,8-diazabicyclo[5.4.0]-7-undecene is abbreviated as DBU, 1,5-diazabicyclo[4.3.0]non-5-ene as DBN and 1,4-diazabicyclo[2.2.2]octane as DABCO. Thereafter, 0.52 moles of zirconia tetra-n-butoxide and 0.48 moles of titanium n-butoxide were added and reacted under further heating whereby the raw material metal compounds were mutually complexed. Then water and ethanol (solvent 2) were added to execute a hydrolysis reaction. In this operation there was added acetic acid or acetylacetone. Also polyvinylpyrrolidone K-30 (PVP) was added as a film formation assisting agent in certain examples (Examples 5, 6, 7). Thereafter, the solvents having a boiling point of 100° C. or lower were completely eliminated by a rotary evaporator, and diethylene glycol monoethyl ether (solvent 3) was so added that the metal oxide concentration converted into the foregoing formula became 10 wt. %.

TABLE 1

| Prod. Ex | Pb (mol) | La (mol) | DBU (mol) | DBN (mol) | DABO (mol) | solvent 1 (mol) | water (mol) | solvent 2 (mol) | acetic acid (mol) | acetyl acetone (ml) | PVP (mol) | solvent 3 (mol) |
|---|---|---|---|---|---|---|---|---|---|---|---|---|
| 1 | 1.03 | 0 | 7.0 | 0 | 0 | 16 | 5.0 | 10 | 7.0 | 0 | 0 | 11 |
| 2 | 1.05 | 0.01 | 0.1 | 0 | 0 | 13 | 9.0 | 7.0 | 0 | 1.5 | 0 | 16 |
| 3 | 1.15 | 0 | 0.8 | 0 | 0 | 10 | 7.0 | 7.0 | 3.0 | 0.5 | 0 | 15 |
| 4 | 1.20 | 0 | 2.0 | 0 | 0 | 10 | 4.5 | 5.0 | 4.0 | 0.7 | 0 | 12 |
| 5 | 1.17 | 0.01 | 1.2 | 0 | 0 | 12 | 6.0 | 15.0 | 7.5 | 1.2 | 0.01 | 12 |
| 6 | 1.06 | 0 | 0.3 | 0 | 0 | 10 | 10 | 8.0 | 0 | 1.0 | 0.6 | 13 |
| 7 | 1.04 | 0 | 10.0 | 0 | 0 | 18 | 4.0 | 10 | 5.0 | 0 | 0.01 | 13 |
| 8 | 1.03 | 0 | 0 | 0.8 | 0 | 16 | 5.0 | 10 | 7.0 | 0 | 0 | 11 |
| 9 | 1.05 | 0 | 0 | 0 | 0.1 | 20 | 9.0 | 7.0 | 0 | 1.5 | 0 | 16 |
| 10 | 1.15 | 0 | 1.2 (formate) | 0 | 0 | 10 | 7.0 | 7.0 | 3.0 | 0.5 | 0 | 15 |
| 11 | 1.10 | 0 | 2.0 (octylate) | 0 | 0 | 10 | 4.5 | 5.0 | 4.0 | 0.7 | 0 | 12 |

Comparative Preparation Example 1

A coating liquid for forming piezoelectric film was prepared in the same manner as in the Preparation Example 2, except that DBU was replaced by diisopropylethylamine.

Comparative Preparation Example 2

A coating liquid for forming piezoelectric film was prepared in the same manner as in the Preparation Example 5, except that a lead acetate hydrate (Pb) and a lanthanum acetate hydrate (La) were mixed and dehydrated, then zirconia isopropoxide and titanium isopropoxide were added and reacted, and diaminoethanol was added instead of DBU.

Comparative Preparation Example 3

A coating liquid for forming piezoelectric film was prepared in the same manner as in the Preparation Example 2, except that the synthesis was conducted without adding DBU. This coating liquid, when let to stand, showed precipitation of white crystals.

Examples 1–9

Figure 3:
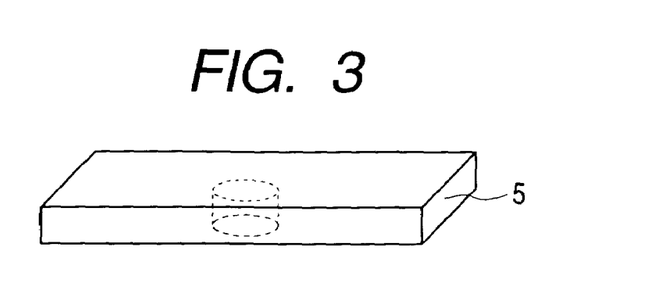
FIG. 3 is a perspective view schematically showing a substrate employed in Examples 1 to 13 and Comparative Examples 1 to 3.
Figure 4:
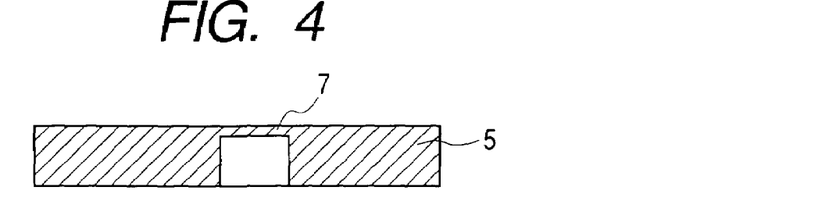
FIG. 4 is a cross-sectional view schematically showing a substrate employed in Examples 1 to 13 and Comparative Examples 1 to 3.
Figure 5:
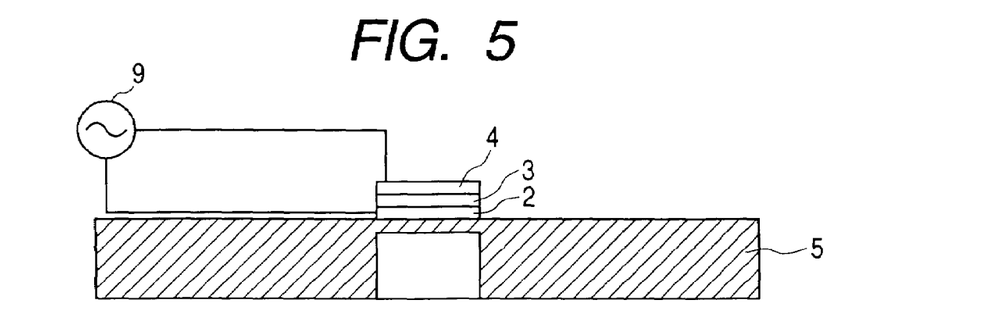
FIG. 5 is a cross-sectional view schematically showing a piezoelectric element prepared in Examples 1 to 13 and Comparative Examples 1 to 3.

On a Zirconia substrate (3 cm square) having a partial recess on a rear surface as shown in FIGS. 3 and 4, each of the coating liquids obtained in the Preparation Examples 1, 3, 4, 6, 7, 8 and 9 was spin coated and was dried for 5 minutes at 100° C. in the air having a relative humidity of 35% at 25° C. (drying step) It was then treated for 5 minutes at 400° C. in a tubular oven of a diameter of 5 cm and a length of 100 cm (including a heater portion of 30 cm), under a gas flow containing oxygen by 30% and nitrogen by 70% and having a relative humidity of 80% at 25° C., with a flow speed of 20 cm/sec (sintering step), and was heat treated for 5 minutes at 650° C. in the same atmosphere (sintering step). After the coating and the heating were repeated three times, a sintering was executed for 40 minutes at 700° C. in the above-mentioned tubular oven and in a gaseous atmosphere containing oxygen by 30% and nitrogen by 70% and having a relative humidity of 75% at 25° C. (sintering step), followed by a cooling to the room temperature in the same humidity atmosphere (cooling step) to obtain a piezoelectric element of the present invention (FIG. 5). An analysis of an intermediate portion of the piezoelectric film provided a metal composition $Pb_{1.0}Zr_{0.52}Ti_{0.48}$.

The film thickness after coating and sintering three times was as follows.

TABLE 2

| Example | Preparation Examples of coating liquid | Film thickness (μm) |
| --- | --- | --- |
| 1 | 1 | 1.45 |
| 2 | 3 | 0.98 |
| 3 | 4 | 1.26 |
| 4 | 6 | 1.47 |
| 5 | 7 | 1.58 |
| 6 | 8 | 1.60 |
| 7 | 9 | 0.77 |
| 8 | 10 | 1.43 |
| 9 | 11 | 1.52 |

Examples 10–11

On a substrate similar to that in the Examples 1–4, each of the coating liquids obtained in the Preparation Examples 2 and 5 was spin coated and was dried for 5 minutes at 100° C. in the air having a relative humidity of 50% at 25° C. (drying step). It was then heated for 20 minutes at 300° C. in a tubular oven of a diameter of 5 cm and a length of 100 cm (including a heater portion of 30 cm), in a gaseous atmosphere containing oxygen by 30% and nitrogen by 70% and having a relative humidity of 90% at 25° C. (sintering step). After the coating and the heating were repeated three times, a sintering was executed for 40 minutes at 750° C. in the above-mentioned tubular oven and in a gaseous atmosphere containing oxygen by 40% and nitrogen by 60% and having a relative humidity of 70% at 25° C. for crystallizing the thin film (sintering step), followed by a cooling to the room temperature in the same humidity atmosphere (cooling step) to obtain a piezoelectric element of the present invention (FIG. 5). An analysis of an intermediate portion of the piezoelectric film provided a metal composition $Pb_{0.99}La_{0.01}Zr_{0.52}Ti_{0.48}$. The film thickness after coating and sintering three times was as follows.

TABLE 3

| Example | Preparation Examples of coating liquid | Film thickness (μm) |
| --- | --- | --- |
| 10 | 2 | 0.79 |
| 11 | 5 | 1.43 |

Example 12

In this example, a piezoelectric element of the present invention was obtained in the same manner as in Example 6, except that air of a relative humidity of 60% at 25° C. was employed at a drying for 5 minutes at 150° C., and that air of a relative humidity of 80% at 25° C. was employed in a heat treatment which was executed by elevating the temperature from 400 to 600° C. at a rate of 2° C./min and maintaining for 10 minutes at 650° C. An analysis of an intermediate portion of the piezoelectric film provided a metal composition $Pb_{0.99}La_{0.01}Zr_{0.52}Ti_{0.48}$. The film thickness after coating and sintering ten times was 2.71 μm.

Example 13

Example 1 was reproduced except that the substrate was changed from a zirconia substrate to a Si wafer (FIG. 5). The film thickness after coating and sintering three times was 1.22 μm.

Comparative Examples 1–2

Piezoelectric elements were obtained in the same manner as in Examples 5 and 6, employing the coating liquid obtained in the Comparative Preparation Examples 1 and 2.

[Evaluation]

The piezoelectric element in each of Examples 1–13 and Comparative Examples 1–2 was prepared in 30 units, which were evaluated as follows.

An amount of displacement, under an application of a voltage of 10 V, 10 kHz between the upper electrode and the lower electrode was measured by a laser Doppler method. Table 4 shows an average and a standard deviation of an initial displacement in 30 elements and a displacement after an operation for 720 hours.

As will be observed from Table 4, the elements showed a larger displacement in comparison with those of Comparative Examples, and a satisfactory operation after a durability test for 720 hours. Also there were obtained elements of a smaller unevenness in the piezoelectric characteristics, in comparison with those of Comparative Examples.

TABLE 4

| | Initial displacement | | Displacement after operation for 720 hours | |
|---|---|---|---|---|
| | Average displacement (μm) | Standard deviation | Average displacement (μm) | Standard deviation |
| Ex. 1 | 1.21 | 0.52 | 1.10 | 0.58 |
| Ex. 2 | 0.81 | 0.47 | 0.76 | 0.49 |
| Ex. 3 | 0.88 | 0.44 | 0.80 | 0.50 |
| Ex. 4 | 0.62 | 0.48 | 0.55 | 0.54 |
| Ex. 5 | 0.78 | 0.61 | 0.62 | 0.67 |
| Ex. 6 | 0.82 | 0.51 | 0.79 | 0.54 |
| Ex. 7 | 1.08 | 0.53 | 1.05 | 0.54 |
| Ex. 8 | 1.42 | 0.55 | 1.39 | 0.58 |
| Ex. 9 | 0.87 | 0.54 | 0.83 | 0.57 |
| Ex. 10 | 1.23 | 0.51 | 1.18 | 0.52 |
| Ex. 11 | 1.11 | 0.55 | 1.07 | 0.54 |
| Ex. 12 | 1.05 | 0.50 | 1.02 | 0.52 |
| Ex. 13 | 0.99 | 0.52 | 0.97 | 0.55 |
| Comp. Ex. 1 | 0.52 | 0.62 | 0.31 | 0.63 |
| Comp. Ex. 2 | 0.73 | 0.79 | 0.44 | 0.85 |
| Comp. Ex. 3 | Evaluation impossible due to cracks in coating | | | |

[Other Evaluations]

Polarization characteristics to an applied electric field were measured in the piezoelectric elements prepared in Example 1 and Comparative Example 1. The measurement was conducted, with HVS-6000, manufactured by Radiants Inc., by applying a voltage of 20 V to the element to obtain a hysteresis curve, which is shown in FIG. 8.

Figure 8:
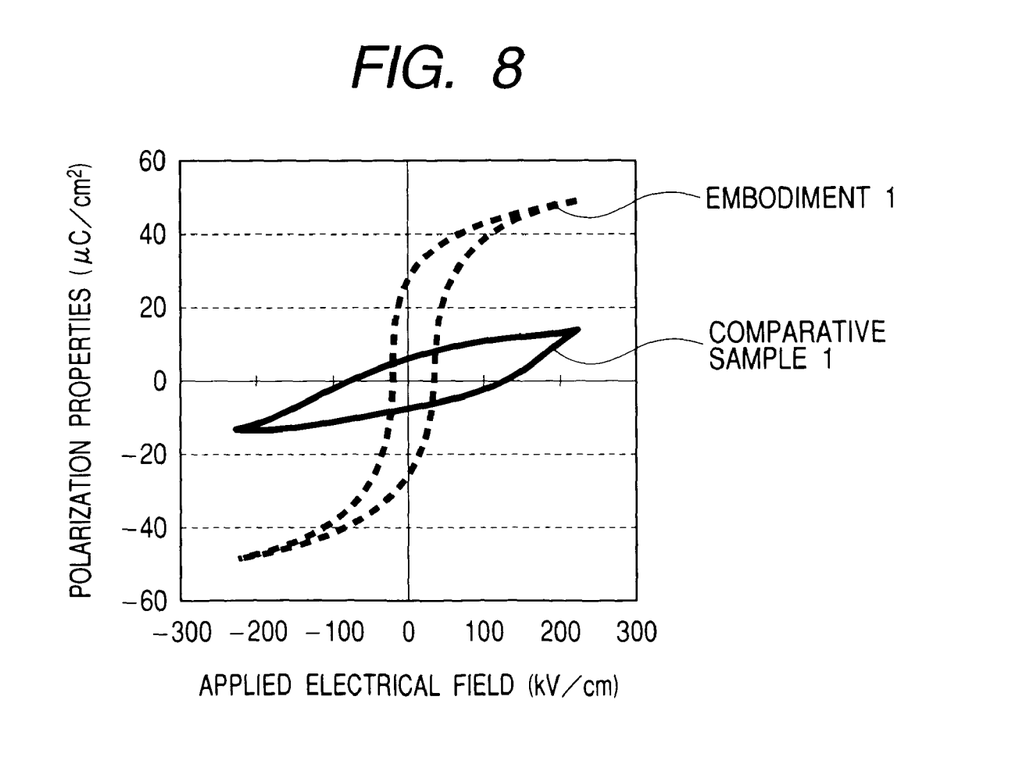
FIG. 8 is a chart showing hysteresis curves of Example 1 and Comparative Example 1.

FIG. 8 indicates that Example 1 showed a larger retentive polarization than in Comparative Example 1. Since such apparent hysteresis can be utilized as a memory element, a memory can be constructed by arranging a plurality of such elements in such a manner that a voltage can be applied individually. More specifically, it can be utilized as a rewritable memory by writing information by supplying a drive signal according to the information to be recorded and by reading information by detecting the direction of polarization. In the use as such memory, the piezoelectric film preferably has a thickness of 0.1 to 2 μm.

Figure 6:
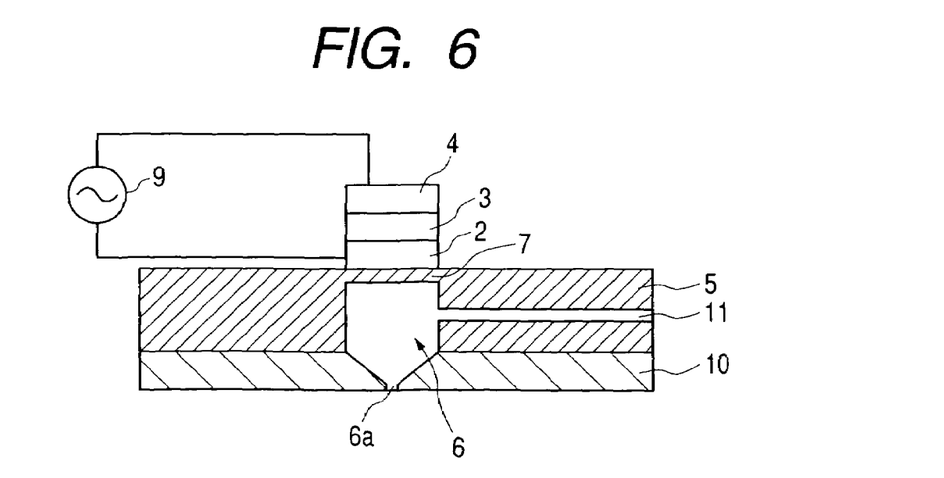
FIG. 6 is a cross-sectional view schematically showing a head employed in an evaluation of the ink jet recording head.
Figure 7:
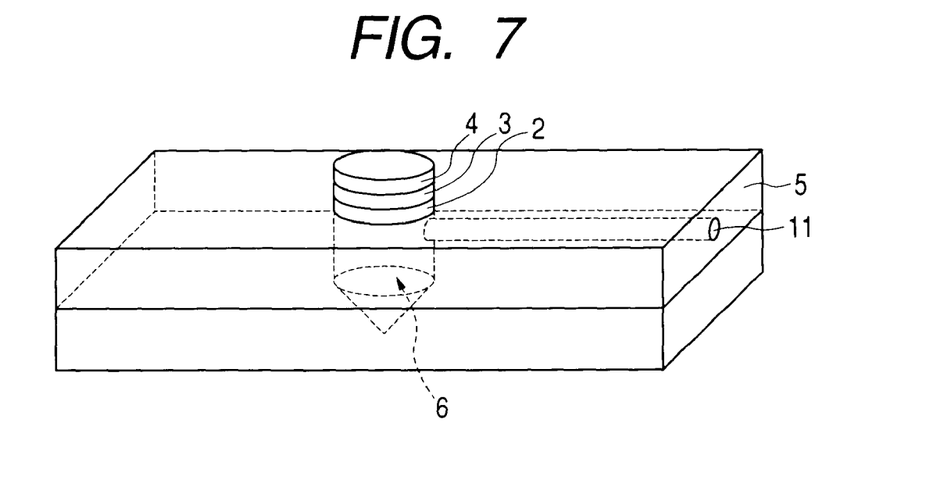
FIG. 7 is a perspective view schematically showing a head employed in an evaluation of the ink jet recording head.

As explained in the foregoing, the piezoelectric film prepared according to the present invention is usable not only as a piezoelectric element of an ink jet recording head but also in various devices such as a memory, a capacitor, a sensor or an optical modulator. FIGS. 6 and 7 illustrate an ink jet recording head provided with a nozzle plate 10 having a nozzle 6a, and a path 11 for introducing ink. A satisfactory recording was made with such ink jet recording head.

What is claimed is:

1. A composition for forming a piezoelectric film, comprising: a dispersoid obtained from a metallic compound, the dispersoid being used to form the piezoelectric film; and at least one material selected from the group consisting of 1,8-diazabicyclo[5.4.0]-7-undecene, 1,5-diazabicyclo[4.3.0]non-5-ene, and 1,4-diazabicyclo[2.2.2]octane.

2. A piezoelectric film-forming composition according to claim 1, wherein said metallic compound is an organometallic compound.

3. A piezoelectric film-forming composition according to claim 1, wherein said at least one material is contained in an amount from 0.005 to 5.0 times of moles with respect to the number of moles of all metal atoms in the piezoelectric film-forming composition.

4. A piezoelectric film forming composition according to claim 1, comprising at least one of elements Pb, La, Zr and Ti as a constituent element.

5. A method for producing a piezoelectric element comprising:
a step of coating a substrate with a piezoelectric film-forming composition containing a dispersoid obtained from a metallic compound, and including at least one material selected from the group consisting of 1,8-diazabicyclo[5,4,0]-7-undecene, 1,5-diazabicyclo[4.3.0]non-5-ene, and 1,4-diazabicyclo[2.2.2]octane, to form a coated film;
a step of drying said coated film; and
a step of sintering said dried film to obtain a piezoelectric film.

6. A piezoclectric element including a piezoelectric film provided between a lower electrode and an upper electrode, wherein said piezoelectric film is prepared by a method according to claim 5.

7. An ink jet recording head comprising a pressure chamber communicating with an ink discharge port, a vibration plate provided corresponding to said pressure chamber, and a piezoelectric element according to claim 6, provided corresponding to said vibration plate, wherein ink in said pressure chamber is discharged from said ink discharge port by a volume change in said pressure chamber caused by said piezoelectric element.

* * * * *

UNITED STATES PATENT AND TRADEMARK OFFICE
CERTIFICATE OF CORRECTION

PATENT NO.        : 7,036,915 B2
APPLICATION NO.   : 10/665571
DATED             : May 2, 2006
INVENTOR(S)       : Shinji Eritate et al.

It is certified that error appears in the above-identified patent and that said Letters Patent is hereby corrected as shown below:

IN THE DRAWINGS
FIG. 8, "SAMPLE 1" should read --EXAMPLE 1--.

COLUMN 1
Line 67, "result" should read --results--.

COLUMN 4
Line 39, "gellation" should read --gelation--.

COLUMN 5
Line 5, "$Pb_{(1-x)}$" should read --$Pb_{(1-x)}$--

COLUMN 6
Line 37, "precitate." should read --precipitate.--.

COLUMN 8
Line 1, "positioned" should read --positions--;
Line 10, "achieving" should read --achieve--;
Line 14, "details" should read --detail--;
Line 22, "$0 \leq y \leq 1$)" should read --$0 \leq y < 1$)--; and
Line 26, "compound" should read --a compound--.

COLUMN 9
Line 28, "Zirconia" should read --zirconia--; and
Line 33, "step) It" should read --step). It--.

UNITED STATES PATENT AND TRADEMARK OFFICE
CERTIFICATE OF CORRECTION

| | |
|---|---|
| PATENT NO. | : 7,036,915 B2 |
| APPLICATION NO. | : 10/665571 |
| DATED | : May 2, 2006 |
| INVENTOR(S) | : Shinji Eritate et al. |

It is certified that error appears in the above-identified patent and that said Letters Patent is hereby corrected as shown below:

<u>COLUMN 12</u>
Line 22, "film forming" should read --film-forming--.

Signed and Sealed this

Twenty-first Day of November, 2006

JON W. DUDAS
*Director of the United States Patent and Trademark Office*